United States Patent
Ong et al.

(10) Patent No.: US 9,899,312 B2
(45) Date of Patent: Feb. 20, 2018

(54) ISOLATING ELECTRIC PATHS IN SEMICONDUCTOR DEVICE PACKAGES

(75) Inventors: Adrian E. Ong, Pleasanton, CA (US); Dong Sik Jeong, Fremont, CA (US)

(73) Assignee: Rambus Inc., Sunnyvale, CA (US)

( * ) Notice: Subject to any disclaimer, the term of this patent is extended or adjusted under 35 U.S.C. 154(b) by 1040 days.

(21) Appl. No.: 11/403,626

(22) Filed: Apr. 13, 2006

(65) Prior Publication Data

US 2007/0241443 A1 Oct. 18, 2007

(51) Int. Cl.
H01L 23/58 (2006.01)
H01L 29/10 (2006.01)
H01L 23/50 (2006.01)
H01L 21/48 (2006.01)
H01L 23/538 (2006.01)

(52) U.S. Cl.
CPC ............ *H01L 23/50* (2013.01); *H01L 21/485* (2013.01); *H01L 23/5382* (2013.01); *H01L 2924/0002* (2013.01)

(58) Field of Classification Search
CPC ................................... H01L 23/5382
USPC .................................... 257/48, 905
See application file for complete search history.

(56) References Cited

U.S. PATENT DOCUMENTS

| | | |
|---|---|---|
| 5,177,594 A | 1/1993 | Chance et al. |
| 5,258,648 A | 11/1993 | Lin |
| 5,327,013 A | 7/1994 | Moore et al. |
| 5,355,283 A | 10/1994 | Marrs et al. |
| 5,517,515 A | 5/1996 | Spall et al. |
| 5,703,400 A | 12/1997 | Wojnarowski et al. |
| 5,717,245 A | 2/1998 | Pedder |
| 5,770,477 A | 6/1998 | Brandenburg |
| 5,840,417 A | 11/1998 | Bolger |
| 5,854,534 A | 12/1998 | Beilin et al. |
| 6,022,758 A | 2/2000 | Badehi |
| 6,052,287 A | 4/2000 | Palmer et al. |
| 6,221,753 B1 | 4/2001 | Seyyedy |
| 6,643,434 B2 | 11/2003 | Cayrefourcq et al. |
| 7,745,920 B2 | 6/2010 | Lee et al. |
| 2005/0063211 A1* | 3/2005 | Atallah et al. ............... 365/145 |
| 2006/0279308 A1* | 12/2006 | Ong ............................ 324/765 |

FOREIGN PATENT DOCUMENTS

EP 0312217 4/1989

* cited by examiner

*Primary Examiner* — Hsin-Yi Hsieh
(74) *Attorney, Agent, or Firm* — Lowenstein Sandler LLP

(57) ABSTRACT

Methods, systems, and apparatus for reducing power consumption or signal distortions in a semiconductor device package. The semiconductor device package includes a semiconductor device, a first electric path, a second electric path, and an isolation element in the first electric path. The second electric path is electrically connected to the first electric path and a functional unit of the device. The isolation element separates an isolated portion in the first electric path from the second electric path, where the isolation element is configured to reduce current in the isolated portion when a signal is passing through the second electric path.

10 Claims, 5 Drawing Sheets

ISOLATING ELECTRIC PATHS IN SEMICONDUCTOR DEVICE PACKAGES

BACKGROUND

The present invention relates to semiconductor devices, and in particular, isolating electric paths in semiconductor device packages.

A semiconductor device includes one or more functional units that are implemented in semiconductor chips. For example, the semiconductor device can include a logics unit, such as an application specific integrated circuit ("ASIC"), and a memory unit, such as a dynamic random access memory ("DRAM"). The logics unit and the memory unit can be implemented in two separate semiconductor chips or embedded in a single semiconductor chip. The semiconductor device can also include a test unit to test the memory unit or the logics unit. The test unit can be implemented in a separate chip, or embedded in the same chip that includes the memory unit or the logics unit, or both.

The semiconductor device is packaged in a device package that includes electric paths through which the functional units communicate with each other and with external devices. The device package also has package pins that are configured to connect the semiconductor device to the external devices to receive input signals or transmit output signals. The device package can be a single-chip carrier that includes a single chip in which the entire semiconductor device is implemented; or the device package can be a multi-chip carrier that includes multiple semiconductor chips, each of which implements one or more functional units of the semiconductor device. In the single-chip or multi-chip carriers, the package pins are implemented by external pads. Alternatively, the device package can include a printed circuit board ("PCB") with one or more chip carriers and the package pins are implemented by standard board connectors.

The semiconductor device package can include one or more shared package pins. A shared pin is connected to multiple functional units that communicate with external devices through the same shared pin. For example, in an application specific semiconductor device, a shared package pin can be used alternately by a logics unit and a memory test unit.

The semiconductor package can also include a package pin that is connected to an internal electric path through which two functional units communicate with each other within the semiconductor device. For example, a functional unit can have an internal input that alternately receives signals from another functional unit within the same package and from an external device through the package pin.

SUMMARY

The present inventors recognized that different electric paths have different operational requirements in a semiconductor device and, if electrically connected, these electric paths may interfere with each other's operation. For example, a busy electric path, which is currently in use, can be connected to an idle path, which is temporarily out of use, and the idle electric path may distort electric signals that pass through the busy electric path; or the interconnection of multiple busy electric paths may cause too much load, noise, or interference when those busy electric paths drive signals to functional units that have different loading or noise requirements. Thus, an isolation element is provided to isolate at least a portion of an electric path from another, otherwise connected electric path.

In general, in one aspect, the present invention provides a semiconductor device package that includes a semiconductor device having a first functional unit and a second functional unit. The semiconductor device package also includes a first package pin to provide an external connection for the semiconductor device, a first electric path connecting the first functional unit to the first package pin, a second electric path connecting the second functional unit to the first package pin, and an isolation element in the first electric path. The isolation element separates the first package pin from an isolated portion in the first electric path, wherein the isolated portion is located between the isolation element and the first functional unit, and the isolation element is configured to reduce current between the first package pin and the isolated portion in the first electric path.

In general, in another aspect, the present invention provides a semiconductor device package that includes a semiconductor device including a first functional unit and a second functional unit. The semiconductor device package also includes an internal electric path between the first and second functional units, a first package pin to provide an external connection for the semiconductor device, a first electric path connecting the internal electric path to the first package pin, and an isolation element in the first electric path. The isolation element separates the first package pin from the internal electric path, wherein the isolation element is configured to reduce current between the first package pin and the internal electric path.

In general, in another aspect, the present invention provides a method for operating a semiconductor device in a semiconductor device package. A signal is transmitted through a second electric path between a second functional unit of the semiconductor device and a shared pin of the semiconductor device package. The shared pin is connected to a first functional unit of the semiconductor device through a first electric path. At least a portion of the first electric path is isolated from the second electric path through which the signal is transmitted.

In general, in another aspect, the present invention provides a method for operating a semiconductor device in a semiconductor device package. A signal is transmitted through an internal electric path between first and second functional units of the semiconductor device, and a first package pin of the semiconductor device package is isolated from the internal electric path through which the signal is transmitted.

Particular implementations can include one or more of the following features. The isolation element can reduce distortions caused by the isolated portion in signals passing through the second electric path. The isolation element can include a resistor in the first electric path. The resistor can have a resistance that is substantially larger than a resistance along the second path or a resistance along the isolated portion in the first electric path. The resistance of the resistor can be larger than about 500 Ohm, for example, between about 1 kOhm and about 5 kOhm. The isolation element can include a switch to connect or interrupt the first electric path. The switch can include a transistor or a multiplexer. The first functional unit can include an application specific integrated circuit, and the second functional unit can include a memory, such as dynamic random access memory. The second functional unit can include a test logic, and the second electric path can connect the test logic to the first package pin. The semiconductor device can be implemented in a single semiconductor chip, and the device package can include a chip carrier to hold the single semiconductor chip. The first functional unit can be implemented in a first semiconductor chip and the second functional unit can be implemented in a second semiconductor chip. The device package can include a first chip carrier and a second chip carrier to hold the first and second semiconductor chips, respectively. The device package can include a printed circuit board that holds the isolation element and the first and second chip carriers.

Particular embodiments can be implemented to realize one or more of the following advantages. By isolating a particular electric path from otherwise connected electric paths or portions of them, an isolation element can reduce capacitive or inductive load for the particular electric path. Due to the reduced load, signal quality may be improved in the particular electric path. By reducing or eliminating current flowing into the connected electric paths, the isolation device may also reduce current dissipation. For example, the isolation element can be implemented with a switch that can "turn off" current into an idle (temporarily out of use) electric path. Thus, the power consumption of the semiconductor device can be lowered. The turned-off switch also isolates the busy electric path from the capacitive and inductive load of the idle path. Thus, the isolation element may also effectively reduce noise. For example, the isolation element may be implemented to reduce (potentially to the point of eliminating) distortions caused by long idle electric paths within a semiconductor device. The isolation element can be implemented in a first electric path that connects a first unit of the device to a shared pin that is also connected to a second unit by a second electric path. When the first electric path is idle and the second electric path is busy, the isolation element can reduce distortions that are caused by the idle first electric path in signals passing through the busy second electric path. An isolation element can also reduce (potentially to the point of eliminating) distortions caused by an idle package pin. If the idle pin is connected to an internal communication path within the device, the isolation device can be implemented to reduce distortions that the idle pin causes in the internal communication signals. As required by functional or economical considerations, the isolation element can be efficiently implemented with or without active circuit elements, such as transistors or multiplexers. Isolation elements can be implemented in a particularly economic way by using only passive circuit elements, such as resistors. The resistors' resistance can be set based on requirements, such as loading or timing requirements, for signals that have to pass through the isolation element. For example, an electric path for low frequency signals can be efficiently isolated with a large resistor. Thus, even though current through the isolating element is reduced, the low frequency signal can still pass through the isolated portion with minimal distortion.

Further technical advantages are readily apparent to one skilled in the art from the following figures, descriptions, and claims.

BRIEF DESCRIPTION OF THE DRAWINGS

Like numerals are used for like and corresponding parts of the various drawings.

DETAILED DESCRIPTION

Figure 1:
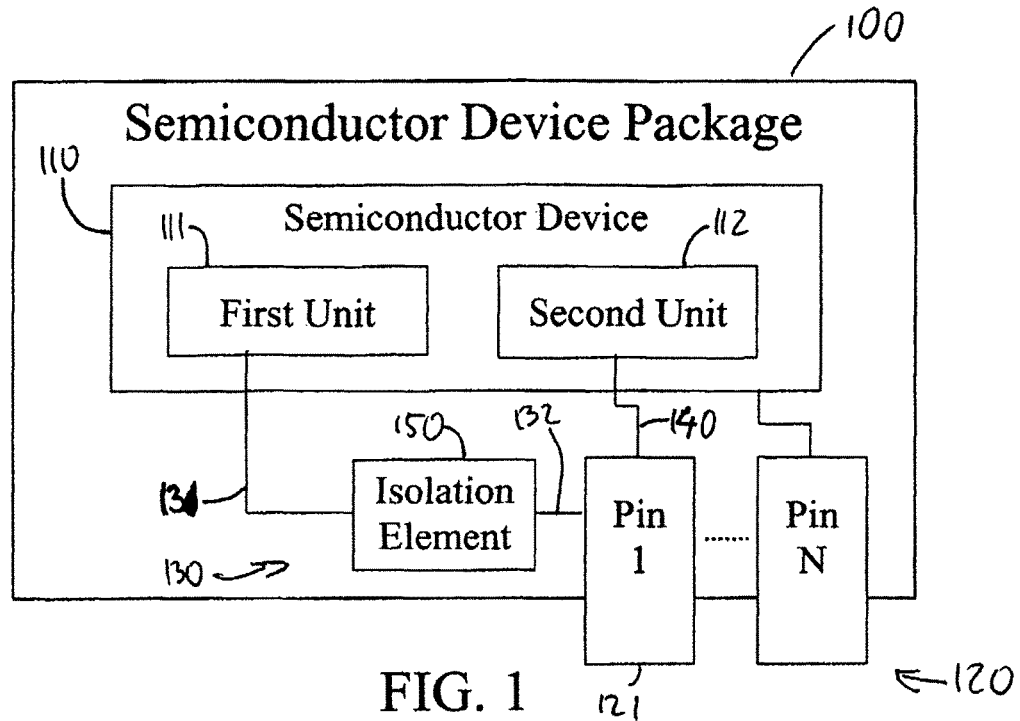
FIGS. 1, 2, 3, 5, 6, 8 and 9 are schematic block diagrams illustrating semiconductor device packages.

FIG. 1 illustrates a semiconductor device package 100 that includes a semiconductor device 110. The semiconductor device 110 can be connected to external devices through a number ("N") of package pins 120. The package pins 120 include a shared package pin 121 that is connected to the semiconductor device 110 by a first electric path 130 and a second electric path 140. The first electric path 130 includes an isolation element 150 that reduces (potentially to the point of eliminating) currents flowing through the first electric path. Thus, the isolation element 150 can reduce load and distortions caused by the first electric path 130 in signals passing from the shared pin 121 through the second electric path 140 to the semiconductor device 110.

The device package 100 provides physical integrity and external connections for the semiconductor device 110. In one implementation, the device package 100 is a single-chip carrier including a single semiconductor chip in which electric circuitry is implemented for the semiconductor device 110. For example, the semiconductor device 110 can be a System-on-Chip ("SoC") device. Alternatively, the device package 100 can be a multi-chip carrier that includes multiple semiconductor chips, each chip implementing one or more functional units of the device 110. For example, the device 110 can be a System-in-Package ("SiP") device. The device package 100 can also include a printed circuit board ("PCB") that holds one or more chips or integrated circuits of the device 110. For example, the device 110 can be a System-on-PCB module. In the semiconductor device 110, the multiple chips can be arranged in a stacked or any other advantageous configuration (e.g., PoP or PiP). Optionally, portions of the device package 100 can be removable. For example, the integrated circuits may be removable from the device package. The device package 100 can also include epoxy, plastic or any other material to provide physical integrity and protection for the device 110 or portions of it. For example, epoxy can be used to seal semiconductor chips that are connected to the circuit board directly, without a chip carrier.

The semiconductor device 110 includes a first functional unit 111 and a second functional unit 112. The first and second functional units 111 and 112 can be implemented in the same or separate chips. In one implementation, the semiconductor device 110 includes an ASIC device in which the first unit 111 includes a memory and the second unit 112 includes a logics circuitry. The first unit 111 can also include a test circuitry to test the memory or the logics, or both. Alternatively, the first and second units 111 and 112 can provide user selectable alternative functions, and can include sensors, oscillators, counters or other data or signal processing circuitry.

The package pins 120 provide external electric connections for the device 110. In one implementation, the package pins 120 are connection points that are used during normal operation of the device 110. The package pins 120 can also include connection points that are available only for testing during manufacturing or servicing of the device 110. If the package 100 is a single-chip carrier or a multi-chip carrier, the package pins 120 can include the pads of that chip carrier. If the package 100 includes a printed circuit board, some or all of the package pins 120 can be implemented in a standard card connector. The package 100 can also include other standard connectors and plugs to implement one or more of the package pins 120.

The package pins 120 include the shared pin 121 that is connected to the first and second units 111 and 112 by the first and second electric paths 130 and 140, respectively. The package pins 120 can also include additional shared pins. In one implementation, the semiconductor device 110 uses the first and second electric paths 130 and 140 alternately. For example, the first unit 111 includes a test circuitry and the device 110 has a "normal mode" and a "test mode." In the normal mode, the second electric path 140 is used to connect the second unit 112 to the shared pin 120. In the test mode, the first electric path 130 is used to connect the first unit's test circuitry to the shared pin 121. In alternative implementations, the first and second electric paths 130 and 140 can be busy at the same time.

The first electric path 130 may distort or increase the load for signals that are passing through the second electric path 140 between the first pin 120 and the second unit 112. For example, if the first electric path 130 is relatively long or has wide portions between the shared pin 121 and the first unit 111, it may have a substantial capacitance. As a result, the first electric path 130 may provide a capacitive load that can increase the current and "round" sharp transitions in signals passing through the second electric path 140. The first electric path 130 may also have an inductance providing an inductive load that can increase the current and cause a "ringing" effect in signals passing through the second electric path 140. Thus, the first path 130 can cause signals distortions in the second path 140 even if the first path 130 is properly isolated within the first unit 111 in its inert state.

The isolation element 150 isolates a first portion 131 of the first electric path 130 from the second electric path 140. The isolation element 150 is a local structure in the first electric path 130, and divides the first electric path 130 into the first portion 131 and a second portion 132. The first portion 131 is closer to the first unit 111 and the second portion 132 is closer to the shared package pin 121. In one implementation, the isolation element 150 is located along the first electric path 130 closer to the shared pin 121 than to the first unit 111 to isolate a larger portion of the electric path 130 from the shared pin 121.

The isolation element 150 includes active or passive circuit elements to reduce (potentially to the point of eliminating) current flowing to the first portion 131 of the first electric path 130 when a signal is passing through the second path 140. Thus, the signal passing through the second electric path 140 will not "see" the full capacitive and inductive load of the first portion 131. Accordingly, the isolation element 150 may reduce (potentially to the point of eliminating) distortions that are caused by the capacitance or the inductance of the first portion 131 of the first electric path 130.

Figure 2:
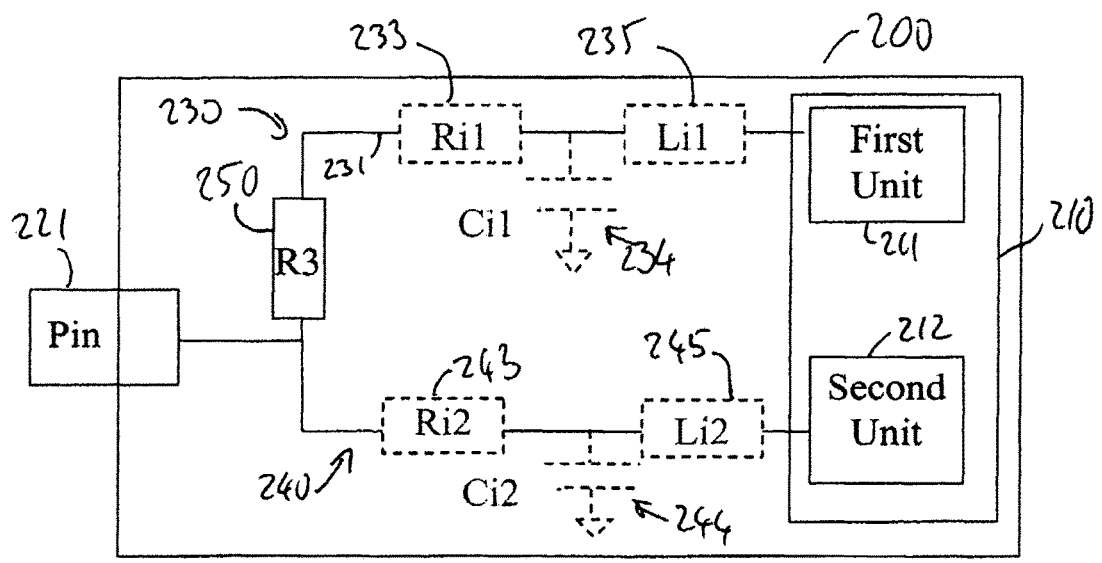

FIG. 2 illustrates a semiconductor device package 200 according to an embodiment of the invention, in which the isolation element is implemented by a passive circuit element, a resistor 250. The device package 200 includes a shared pin 221 and a semiconductor device 210 that has first and second functional units 211 and 212. For clarity, other pins of the device package 200 are not shown. The shared pin 221 is connected by first and second electric paths 230 and 240 to the first and second functional units 211 and 212, respectively. The resistor 250 is in the first path 230, and separates an isolated portion 231 of the first path 230 from the second path 240.

The isolated portion 231 of the first electric path 230 has an inherent resistance 233 (Ri1), an inherent capacitance 234 (Ci1), and an inherent inductance 235 (Li1). The second path 240 has an inherent resistance 243 (Ri2), an inherent capacitance 244 (Ci2), and an inherent inductance 245 (Li2). For illustrative purposes, FIG. 2 shows the inherent resistances 233 and 243, capacitances 234 and 244, and inductances 235 and 245 as discrete elements, although these elements are continuously distributed along the isolated portion 231 and the second path 240, respectively.

The resistor 250 has a resistance R3 that can be set to isolate the portion 231 of the first path 230 effectively from the second electric path 240. In one implementation, the resistance R3 is substantially larger than the inherent resistances Ri1 and Ri2. For example, if the inherent resistances Ri1 and Ri2 have a value of a few Ohms, the resistance R3 can have a value that is larger than about 500 Ohms, such as a few thousand Ohms, for example, between about 1 kOhm and 5 kOhm. Thus, the resistor 250 substantially limits current flowing into the isolated portion 231 when the second path 240 is busy conducting signals between the shared pin 221 and the second unit 212.

Without the resistor 250, current could flow readily to the inherent capacitance Ci1 and inductance Li1 of the first portion 231 of the first path 230, thus increasing the overall current load and causing a distortion of a signal passing through the second path 240. This distortion would be in addition to any other signal distortion caused by the inherent capacitance Ci2 and inductance Li2 of the second path 240 itself.

When the resistor 250 is provided, the portion 231 of the first path 230 is isolated from the second path 240, and accordingly, distortions are caused substantially only by the inherent capacitance and inductance of the second path 240 and the portion of the first path 230 that is between the resistor 250 and the second path 240. By isolating the portion 231 of the first path 230, the resistor 250 reduces the total load on the signal, and thus power consumption and signal distortions are also reduced. The total signal distortion can be further reduced by making the second path 240 shorter, or positioning the resistor 250 on the first path 230 closer to the second path 240.

The resistor 250 allows signals to pass to the first unit 211 through the first path 230 at the same time as those signals pass to the second unit 212. The resistance R3 of the resistor 250 can be set according to a typical current load or frequency f1 of the signals passing through the first path 230. In one implementation, the resistance R3 is selected such that the typical signal frequency f1 is smaller than a characteristic upper cutoff frequency determined by the resistance R3 and the inherent characteristics of the first path 230, for example, the inherent capacitance Ci1.

Figure 3:
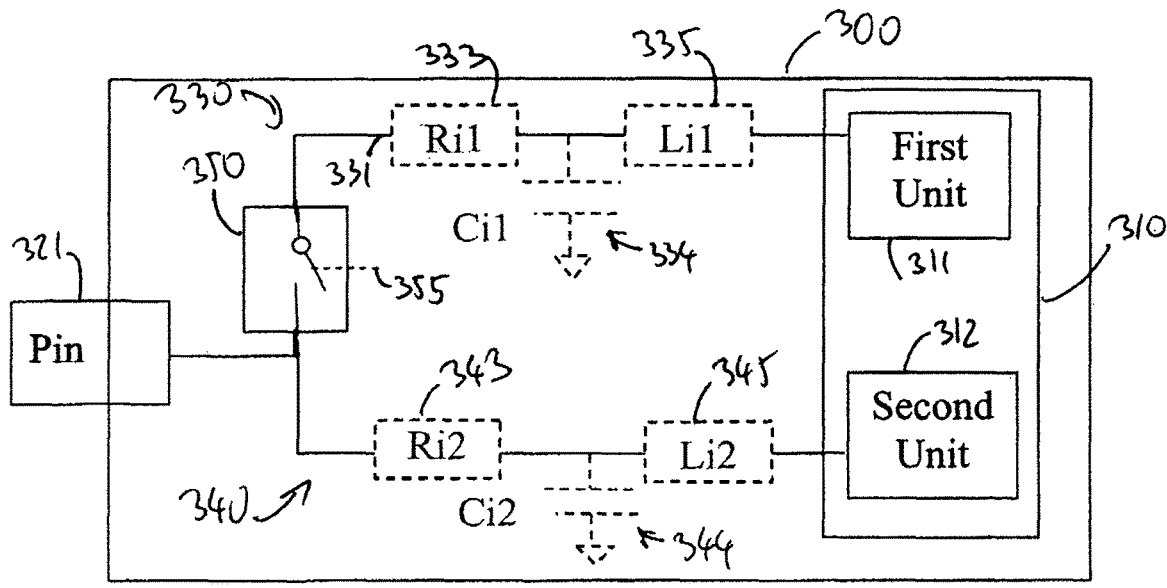

FIG. 3 illustrates a semiconductor device package 300 in which the isolation element is implemented by an active circuit element, such as a switch 350. In one implementation, the switch 350 includes one or more transistors. In alternative implementations, the switch 350 can include one or more additional or different active circuit elements, for example, a multiplexer, an inverter, or a repeater.

The device package 300 includes a shared pin 321 and a semiconductor device 310 that has first and second functional units 311 and 312. For clarity, other pins of the device package 300 are not shown. The shared pin 321 is connected by first and second electric paths 330 and 340 to the first and second functional units 311 and 312, respectively. The switch 350 is implemented in the first path 330, and separates an isolated portion 331 of the first path 330 from the second path 340. The switch 350 can "turn off" current flowing to the isolated portion 331 when the first path is idle (that is, temporarily out of use).

In an alternative implementation, the switch 350 includes a multiplexer that alternately connects the first and second paths 330 and 340 to the shared pin 321. Or in addition to the switch 350 in the first path 330, another switch can be implemented in the second path 340.

The isolated portion 331 of the first electric path 330 has an inherent resistance 333 (Ri1), an inherent capacitance 334 (Ci1), and an inherent inductance 335 (Li1). The second path 340 has an inherent resistance 343 (Ri2), an inherent capacitance 344 (Ci2), and an inherent inductance 345 (Li2). For illustrative purposes, FIG. 3 shows the inherent resistances 333 and 344, capacitances 334 and 344, and inductances 335 and 345 as discrete elements, although these elements are continuously distributed along the isolated portion 331 and the second path 340, respectively.

The switch 350 connects or disconnects the isolated portion 331 of the first path to the shared pin 321 according to a control signal 355. The control signal 355 can be generated based on whether the first path 330 between the first unit 311 and the shared pin 321 is busy or idle. For example, the first unit 311 and the first path 330 can be busy in a first mode and idle in a second mode of the semiconductor device 310, and the control signal 355 can respectively close or open the switch 350.

If the first path 330 is idle, the switch 350 is open to isolate the portion 331 of the first path 330 from the shared pin 321, and thus, from the second path 340. Accordingly, no current can flow into the isolated portion 331 of the first path 330, and the switch 350 can reduce the load, and accordingly distortions, of signals passing through the second path 340.

Figure 4:
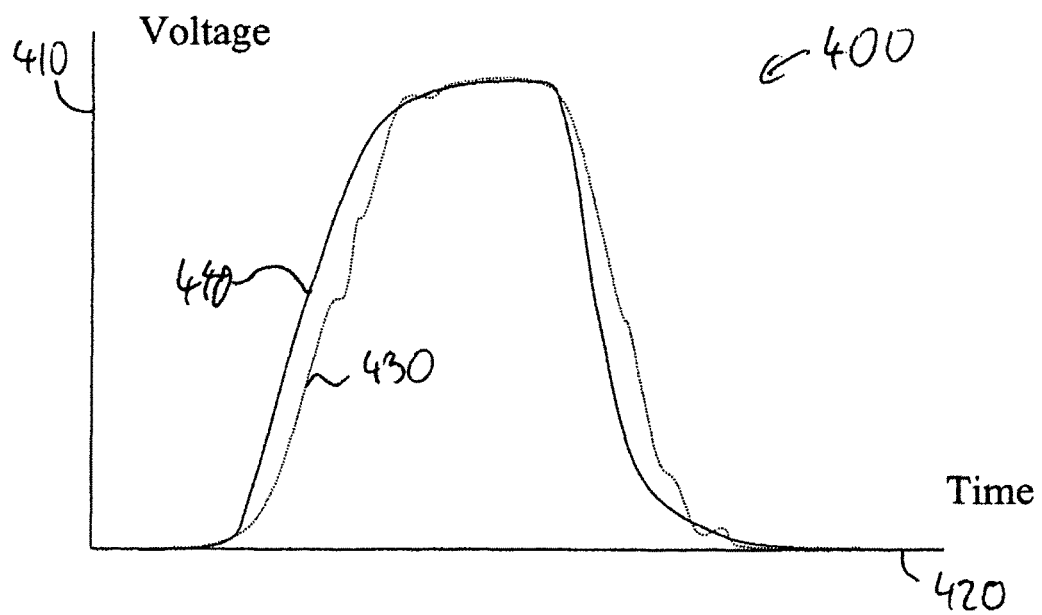
FIG. 4 is a diagram illustrating exemplary waveform characteristics of signals passing through a shared pin with and without an isolation element.

FIG. 4 is a diagram 400 illustrating exemplary waveform characteristics of signals passing through a shared pin of a semiconductor device package, such as the device packages 100, 200, and 300 (FIGS. 1, 2, and 3, respectively). The shared pin is connected to multiple function units through different electric paths.

The diagram 400 includes a vertical voltage axis 410 and a horizontal time axis 420, and illustrates first and second signal traces 430 and 440 as a function of time. The first signal trace 430 represents a signal passing through the shared pin to a busy functional unit of the device when no isolation element is provided to isolate idle portions of electric paths connected to the same shared pin. The second signal trace 440 represents a signal passing through the shared pin to a busy functional unit of the device when an isolation element is provided to isolate the idle portions of the electric paths connected to the shared pin.

The isolation element reduces signal distortion, as shown by a comparison of the first and second signal traces 430 and 440. The first trace 430 illustrates that the signal without isolation has a slower rise and fall and includes fluctuations due to the interaction with the idle electric paths. The second trace 440 illustrates that the signal has a faster rise and fall, and less fluctuation when the isolation element isolates the idle electric paths.

Figure 5:
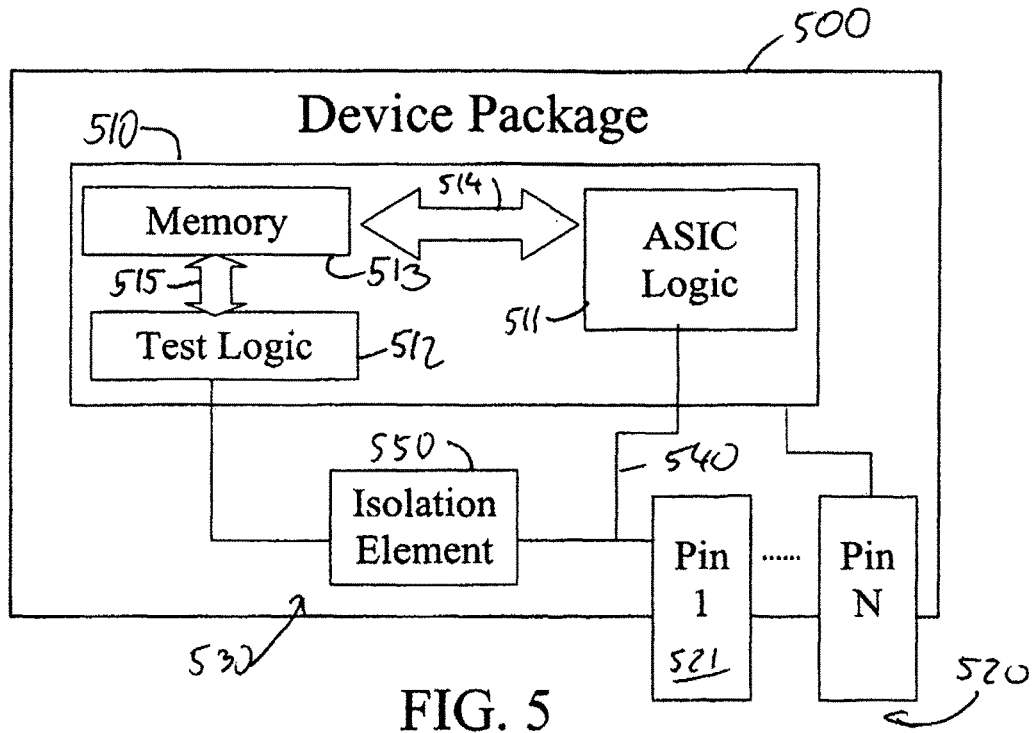

FIG. 5 illustrates a semiconductor device package 500 that includes a semiconductor device 510. The semiconductor device 510 includes an ASIC logic 511, a test logic 512 and a memory 513. The ASIC logic 511 communicates with the memory 513 through electric connections 514, and the test logic 512 communicates with the memory 513 through connections 515. The device package 500 includes package pins 520 to provide electric connections between the ASIC device 510 and external devices.

In one implementation, the device package 500 includes a printed circuit board and each of the ASIC logic 511, test logic 512, and memory 513 are implemented in separate chips in single-chip or multi-chip carriers. For example, each chip can be implemented in a separate single-chip carrier. Or the ASIC logic 511 is implemented in a first chip carrier, and the test logic 512 and the memory 513 are implemented in a second chip carrier that can be either single-chip or multi-chip carrier. In alternative implementations, the device package 500 itself is a single-chip carrier or a multi-chip carrier.

The package pins 520 include a shared package pin 521 that is connected to the test logic 512 by a first electric path 530 and to the ASIC logic 511 by a second electric path 540. The first electric path 530 includes an isolation element 550. The isolation element can reduce load, and accordingly distortions, of signals passing from the shared pin 521 through the second electric path 540 to the ASIC logic 511. In one implementation, the isolation element 550 includes a resistor. Alternatively, the isolation element 550 can include a switch formed by one or more active circuit elements, such as a transistor or a multiplexer, an inverter, or a repeater.

Figure 6:
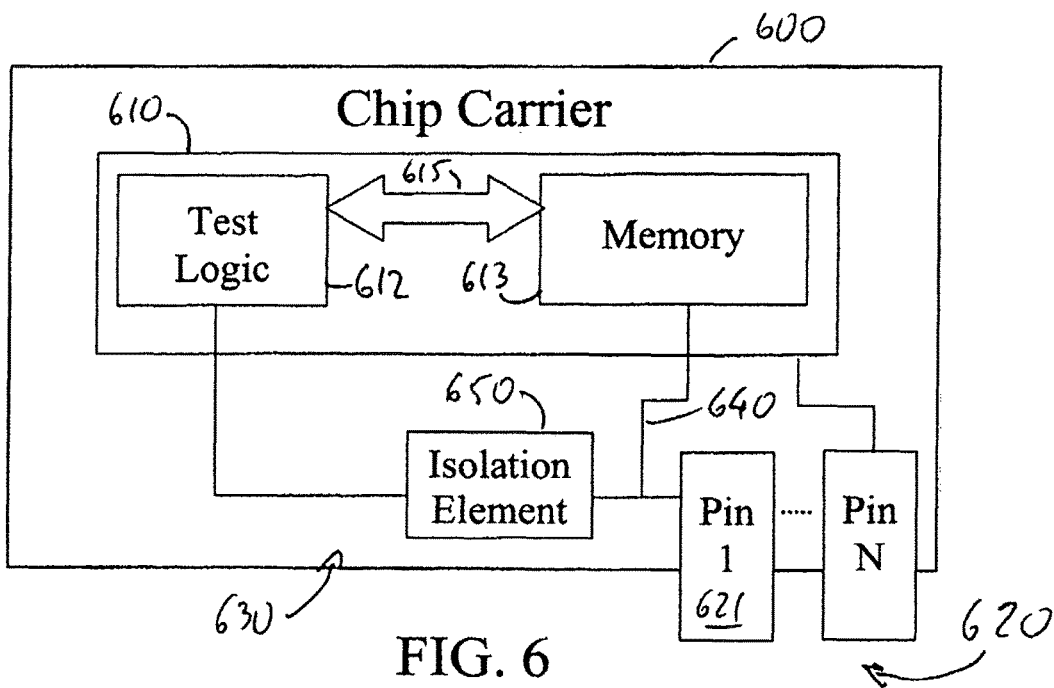

FIG. 6 illustrates a chip carrier 600, such as a SoC. The chip carrier 600 includes a semiconductor device 610 including a test logic 612 and a memory 613. The test logic 612 communicates with the memory 613 through connections 615. In one implementation, the chip carrier 600 is used in the device package 500 to carry the test logic 512 and the memory 513 (FIG. 5).

The chip carrier 600 includes package pins 620 to provide electric connections between the semiconductor device 610 and external devices. In one implementation, the test logic 612 and the memory 613 are implemented in a single chip. Alternatively, the test logic 612 and the memory 613 can be implemented in separate chips.

The package pins 620 include a shared package pin 621 that is connected to the test logic 612 by a first electric path 630 and to the memory 613 by a second electric path 640. The first electric path 630 includes an isolation element 650. The isolation element can reduce load and distortions of signals passing from the shared pin 621 through the second electric path 640 to the memory 613. In one implementation, the isolation element 650 includes a resistor. Alternatively, the isolation element can be implemented by an active switch including a transistor or a multiplexer.

Figure 7:
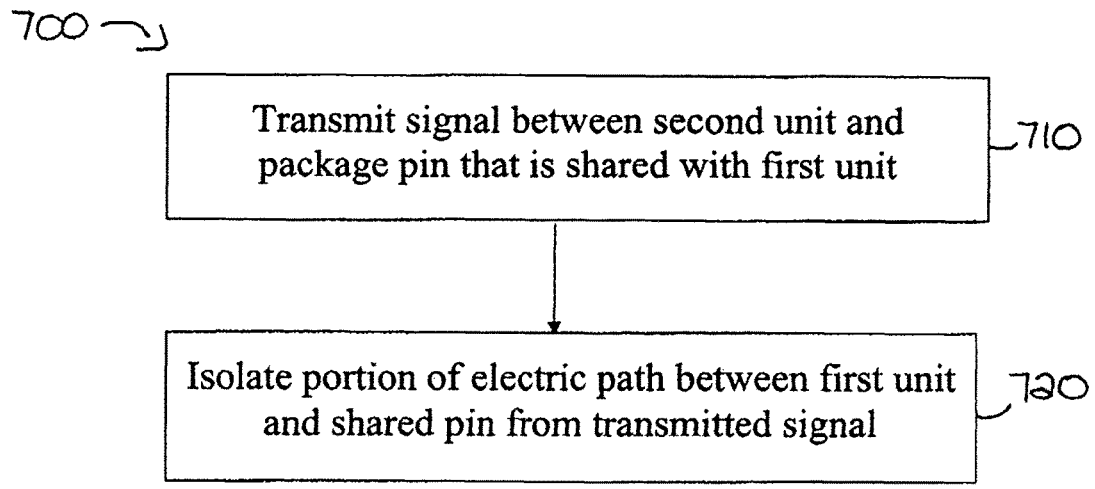
FIGS. 7 and 10 are flow charts illustrating methods for reducing signal distortions caused by an idle portion of an electric path in a device package.

FIG. 7 illustrates a method 700 for reducing (potentially to the point of eliminating) distortions caused by electric paths connected to shared pins of semiconductor device packages. The method 700 can be performed by a system that includes a semiconductor device package, such as the device package 100, 200, 300, 500, or the chip carrier 600 (FIG. 1, 2, 3, 5, or 6, respectively). The semiconductor device package includes a shared pin and first and second functional units connected to the shared pin by first and second electric paths.

The system transmits a signal through the second electric path between the second functional unit and the shared pin (step 710). The signal can be transmitted to or from the second unit.

The system isolates at least a portion of the first electric path between the first functional unit and the shared pin from the signal transmitted through the second electric path (step 720). This can be accomplished using an isolation element which is provided in the first path, and defines the isolated portion of the first path. The isolation element can include one or more passive circuit elements, such as one or more resistors, or active circuit elements that form a switch. The isolation element reduces current flowing into the isolated portion of the first path. Thus, the first path causes less distortion in the signal transmitted through the second path.

Figure 8:
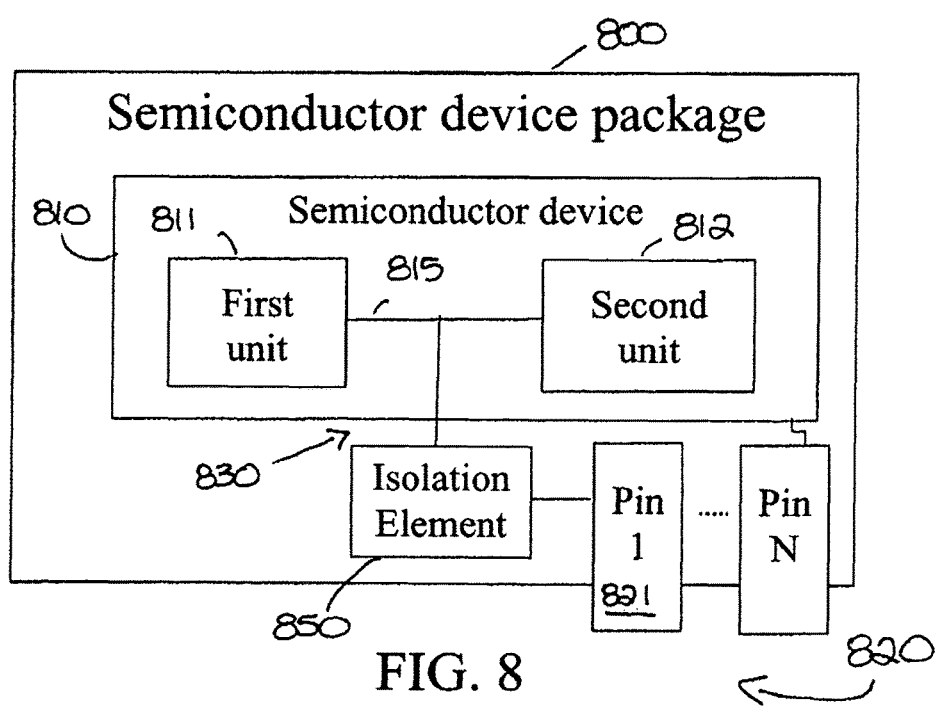

FIG. 8 illustrates a semiconductor device package 800, according to an embodiment of the invention. The device package 800 includes a semiconductor device 810 that can be connected to external devices through a number ("N") of package pins 820. The semiconductor device 810 includes first and second functional units 811 and 812 that can communicate with each other through an internal communication path 815. The package pins 820 include a first package pin 821 that is connected to the internal communication path 815 by a first electric path 830. Through the electric path 830 and the first pin 821, the first or second unit 811 or 812 can communicate with an external device. For example, the first functional unit 811 can alternately receive input from the second unit 812 or from an external device through the first package pin 821.

The first electric path 830 includes an isolation element 850 to isolate the first pin 821 from the internal path 815. The isolation element 850 reduces current flowing to or from the first pin 821 when signals are passing through the internal path 815 within the semiconductor device 810. Thus, the isolation element 850 reduces (potentially to the point of eliminating) distortions caused by the first pin 821 in the signals passing through the internal path 815 between the first and second units 811 and 812. The isolation element 850 can be implemented with one or more passive or active circuit elements.

Figure 9:
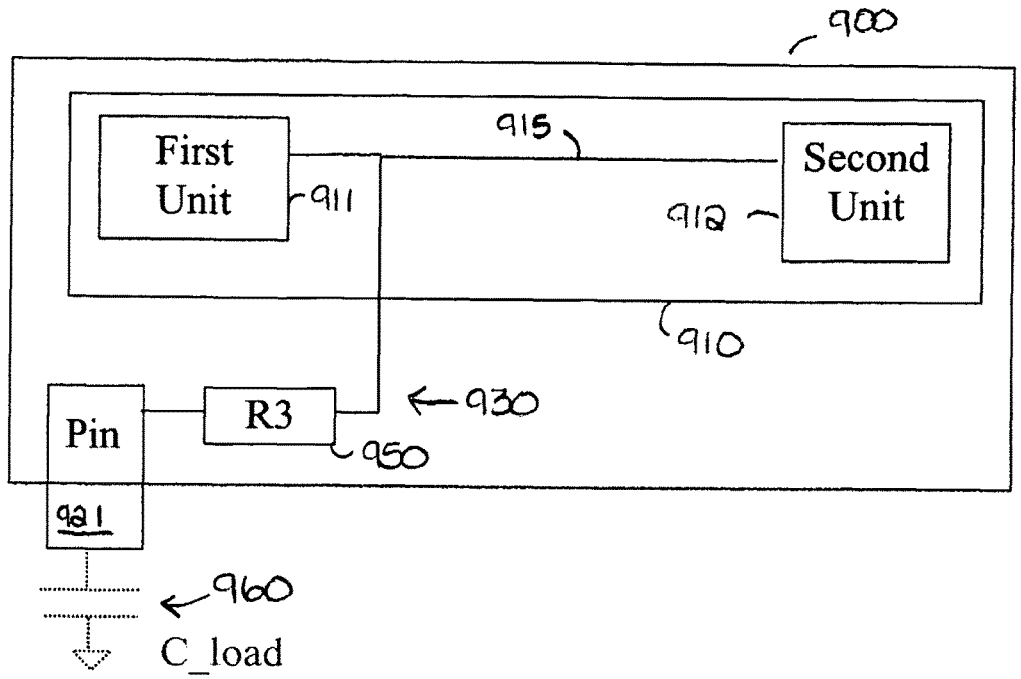

FIG. 9 illustrates a semiconductor device package 900, according to an embodiment of the invention, in which the isolation element is implemented with a resistor 950. The device package 900 includes a semiconductor device 910 that has first and second functional units 911 and 912 that can communicate with each other through an internal communication path 915. The device package 900 also includes a first pin 921 that is connected by a first electric path 930 to the internal path 915. For clarity, other pins of the device package 900 are not shown.

The resistor 950 is implemented in the first path 930 to isolate the first pin 921 from the internal path 915. The first pin 921 has an inherent capacitance 960 (C_load, including wire bonding and substrate routing) that can distort signals passing through the internal path 915 between the first and second units 911 and 912. The capacitance value C_load may be different for different packages. For SiP, C_load can range from about 5 pf to 10 pf. If the device is implemented in a PCB with traces to another units on the same PCB, then C_load may range from about 15 pF to 30 pF, depending on the trace length. The resistor 950 has a resistance R3 that can be set to isolate the first pin 921 effectively from the internal path 915. Thus, the resistor 950 can reduce power consumption and the distortions caused by the first pin 921.

In one implementation, the resistance R3 of the resistor 950 is substantially larger than the inherent resistance of the internal path 915. For example, the resistance R3 can have a value that is larger than 500 Ohms, such as a few thousand Ohms, for example, between about 1 kOhm and 5 kOhm, such as about 2 kOhm.

Figure 10:
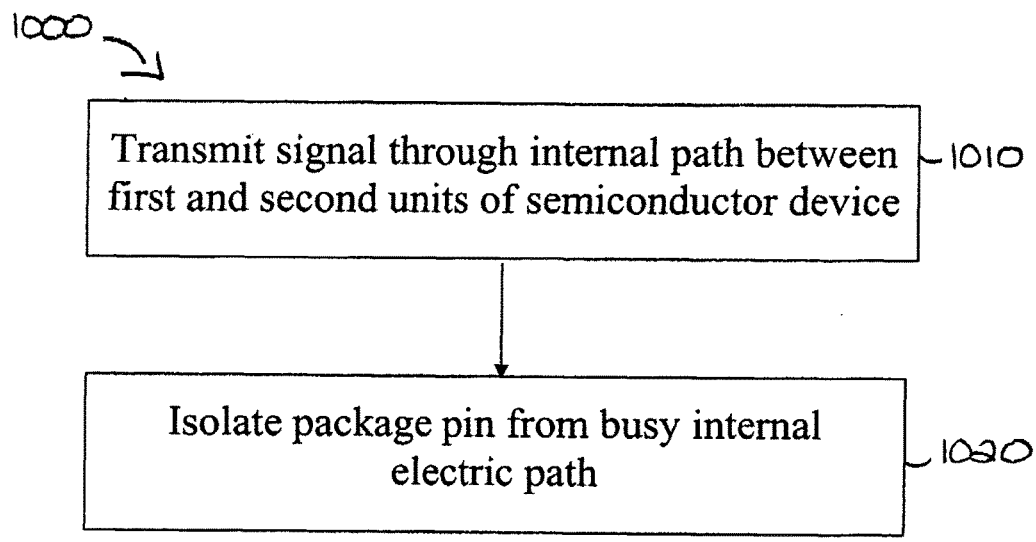

FIG. 10 illustrates a method 1000 for reducing distortions caused by a package pin of a semiconductor device package including a semiconductor device. The package pin is connected by a first path to an internal path through which two functional units communicate within the semiconductor device. The method 1000 can be performed by a system that includes a semiconductor device package, such as the device package 800 or 900 (FIG. 8 or 9, respectively).

The system transmits a signal through the internal electric path between the first and second functional units of the semiconductor device (step 1010). The signal can be transmitted in either direction between the first and second units.

The system isolates the package pin from the internal electric path between the first and second units (step 1020). This can be accomplished using an isolation element, which is provided in the first path connecting the idle pin to the internal path. The isolation element can include one or more passive circuit elements, such as one or more resistors, or active circuit elements, such as transistors or multiplexers that form a switch. The isolation element reduces current flowing into the idle pin. Thus, the idle pin causes less distortion in the signal transmitted through the internal path.

The techniques of the present application have been described with reference to particular implementations. Other implementations are within the scope of the following claims, and can include many variations. For example, although the described implementations include electric paths connected to package pins, other implementations can include only internal electric paths of a semiconductor device. Furthermore, although particular semiconductor devices and device packages have been discussed, the described techniques can be used for other devices and device packages. Steps in the described methods can be performed in different order and still provide desirable results.

The invention claimed is:

1. A semiconductor device package, comprising:
    a semiconductor device comprising a first functional unit and a second functional unit;
    a first package pin to receive a signal and to provide an external connection for the semiconductor device;
    a first electric path connecting the first functional unit to the first package pin;
    a second electric path connecting the second functional unit to the first package pin, wherein signals can pass from the first package pin through the second electric path to the second functional unit regardless of a configuration of a switch in the first electric path; and
    the switch in the first electric path, wherein the configuration of the switch is controlled by a control signal generated based on whether the first electric path is busy or idle,
        wherein, when the switch is in a first configuration, the first package pin is electrically separated from the first functional unit, so that no current flows between the first functional unit and the first package pin on the first electric path; and
        wherein, when the switch is in a second configuration, the first package pin is electrically coupled to the first functional unit, so that current flows between the first functional unit and the first package pin on the first electric path.

2. The semiconductor device package of claim 1, wherein, in the first configuration, the switch reduces distortions caused by a portion of the first electric path between the switch and the first functional unit in signals passing through the second electric path.

3. The semiconductor device package of claim 1, wherein the switch comprises at least one of a transistor, an inverter, or a repeater.

4. The semiconductor device package of claim 1, wherein the first functional unit comprises an application specific integrated circuit, and the second functional unit comprises a memory.

5. The semiconductor device package of claim 4, wherein the memory comprises dynamic random access memory.

6. The semiconductor device package of claim 1, wherein the second functional unit comprises a test logic, and the second electric path connects the test logic to the first package pin.

7. The semiconductor device package of claim 1, wherein the semiconductor device is implemented in a single semiconductor chip, and the device package further comprises:
 a chip carrier to hold the single semiconductor chip.

8. The semiconductor device package of claim 1, wherein the first functional unit is implemented in a first semiconductor chip, the second functional unit is implemented in a second semiconductor chip.

9. The semiconductor device package of claim 8, further comprising:
 a first chip carrier and a second chip carrier to hold the first and second semiconductor chips, respectively.

10. The semiconductor device package of claim 9, further comprising:
 a printed circuit board that holds the switch and the first and second chip carriers.

* * * * *